United States Patent
Tang et al.

(10) Patent No.: US 7,098,507 B2
(45) Date of Patent: Aug. 29, 2006

(54) FLOATING-BODY DYNAMIC RANDOM ACCESS MEMORY AND METHOD OF FABRICATION IN TRI-GATE TECHNOLOGY

(75) Inventors: Stephen H. Tang, Pleasanton, CA (US); Ali Keshavarzi, Portland, OR (US); Dinesh Somasekhar, Portland, OR (US); Fabrice Paillet, Hillsboro, OR (US); Muhammad M. Khellah, Tigard, OR (US); Yibin Ye, Portland, OR (US); Shih-Lien L. Lu, Portland, OR (US); Brian Doyle, Portland, OR (US); Suman Datta, Beaverton, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 10/879,480

(22) Filed: Jun. 30, 2004

(65) Prior Publication Data

US 2006/0014331 A1    Jan. 19, 2006

(51) Int. Cl.
*H01L 27/01* (2006.01)
*H01L 27/12* (2006.01)
*H01L 31/39* (2006.01)

(52) U.S. Cl. .................. 257/347; 257/402; 438/149

(58) Field of Classification Search ............... 257/347, 257/351, 401, 402, 407, 412, 413; 438/149, 438/151, 156, 157, 479
See application file for complete search history.

(56) References Cited

U.S. PATENT DOCUMENTS

| | | | |
|---|---|---|---|
| 6,303,425 B1 * | 10/2001 | Maeda et al. ............ | 438/239 |
| 6,919,601 B1 * | 7/2005 | Inaba ..................... | 257/347 |
| 2004/0036126 A1 | 2/2004 | Chau et al. | |
| 2004/0094807 A1 | 5/2004 | Chau et al. | |

OTHER PUBLICATIONS

T. Ohsawa et al, "Memory design using one-transistor gain cell on SOI," 2002 International Solid-State Circuits Conference, p. 152.
B. Doyle et al, "Tri-gate fully-depleted CMOS transistors: fabrication, design and layout," 2003 Symposium on VLSI Technology.
David Lammers, "Intel Peers Through 3 Gates at Post-planar-CMOS World," EETimes, Oct. 2, 2002.
G.A. Brown et al, "Scaling CMOS: materials and devices," materialstoday, pp. 20-25, Jan. 2004.

* cited by examiner

*Primary Examiner*—Phuc T. Dang
(74) *Attorney, Agent, or Firm*—Russ Swindell

(57) ABSTRACT

A floating-body dynamic random access memory device may include a semiconductor body having a top surface and laterally opposite sidewalls formed on a substrate. A gate dielectric layer may be formed on the top surface of the semiconductor body and on the laterally opposite sidewalls of the semiconductor body. A gate electrode may be formed on the gate dielectric on the top surface of the semiconductor body and adjacent to the gate dielectric on the laterally opposite sidewalls of the semiconductor body. The gate electrode may only partially deplete a region of the semiconductor body, and the partially depleted region may be used as a storage node for logic states.

30 Claims, 7 Drawing Sheets

600

602 - Patterning a silicon film formed on an insulating substrate into a silicon body having a top surface opposite a bottom surface formed on the insulating film, and a first and second laterally opposite sidewalls

604 - Forming a gate dielectric layer on the top surface of the silicon body and on the sidewalls of the silicon body

606 - Depositing a gate material over the silicon body and over the insulating substrate

608 - Patterning the gate material to form a gate electrode on the gate dielectric layer on the top surface of the silicon body and adjacent to the gate dielectric on the sidewalls of the silicon body, the gate electrode having laterally opposite sidewalls which run perpendicular to the laterally opposite sidewalls of the silicon body

610 - Forming a pair of source/drain regions in the silicon body on opposite sides of the laterally opposite sidewalls of the gate electrode, wherein the gate electrode has a gate length less than or equal to half of a width between laterally opposite sidewalls of the silicon body

612 - Optional - Forming a pair of sidewall spacers on opposite sides of laterally opposite sidewalls of the gate electrode

614 - Optional - Forming a silicon film on and around the silicon body and adjacent to the sidewall spacers

616 - Optional - Forming a silicide on the silicon film formed on the silicon body

618 - Optional - Forming the silicon film by a selective deposition process

FLOATING-BODY DYNAMIC RANDOM ACCESS MEMORY AND METHOD OF FABRICATION IN TRI-GATE TECHNOLOGY

BACKGROUND OF THE INVENTION

Efforts to integrate more on-die memory, that is, larger caches, with a microprocessor are guided by the premise that to do so is a power-efficient means of achieving better performance. For example, the area used by six transistor (6T) SRAM cells, which are typically used in large caches, is limited by constraints on die size and to limit manufacturing costs. Thus, a key to enabling larger caches is minimizing the additional cost of incorporating a denser memory cell than SRAM.

One transistor—One Capacitor (1T-1C) DRAM cells have been proposed. These DRAM cells strive to be ten times smaller in area than traditional SRAM cells. The design goals for these DRAM cells need to account for the greater costs involved in making a capacitor that can store enough charge to maintain reasonable refresh times. For example, capacitances at least of 25 fF are calculated to be required.

The recent work in DRAM gain cells has sought to fabricate cells using standard complementary metal oxide semiconductor (CMOS) processes. Such cells may be less expensive to manufacture and more scalable to future device technologies than the SRAM cells, since they do not need a fixed capacitor value. With these goals in mind, it is, therefore, desirable to devise an integrated DRAM that provides for larger memory caches without additional process complexity or costs.

BRIEF DESCRIPTION OF THE DRAWINGS

The accompanying drawings, which are incorporated herein and form part of the specification, illustrate embodiments of the present invention and, together with the description, further serve to explain the principles of embodiments of the invention.

FIG. 6 is a flowchart illustrating a fabrication method in accordance with embodiments of the invention.

It should be understood that these figures depict embodiments of the invention. Variations of these embodiments will be apparent to persons skilled in the relevant art(s) based on the teachings contained herein. For example, the flow charts contained in these figures depict particular operational flows. However, the functions and steps contained in these flow charts can be performed in other sequences, as will be apparent to persons skilled in the relevant art(s) based on the teachings contained herein.

DETAILED DESCRIPTION OF THE INVENTION

One embodiment of the invention is a novel floating-body DRAM (FBDRAM) in a tri-gate transistor structure and its method of fabrication. In the following description numerous specific details are set forth in order to provide a thorough understanding of the present invention. In other instances, well-known semiconductor process and manufacturing techniques have not been described in particular detail in order to not unnecessarily obscure the invention.

In an embodiment of the present invention, the FBDRAM may be implemented in a semiconductor on insulator (SOI) transistor. The FBDRAM may be used in partially depleted substrate transistor applications. In an embodiment of the present invention, the FBDRAM is configured using tri-gate technology that may include a thin semiconductor body formed on a substrate. The substrate may be an insulating substrate or a semiconductor substrate. A gate dielectric may be formed on the top surface and the sidewalls of the semiconductor body. A gate electrode may be formed on the gate dielectric on the top surface of the semiconductor body and may be formed adjacent to the gate dielectric formed on the sidewalls of the semiconductor body. Source and drain regions may be formed in the semiconductor body on opposite sides of the gate electrode. Because the gate electrode and the gate dielectric may surround the semiconductor body on three sides, thus, the FBDRAM may have three separate channels and gates. The gate "width" of a FBDRAM is equal to the sum of each of the three sides of the semiconductor body, and the floating-body region, described in further detail elsewhere herein, may be influenced by elongations in the gate "width". According to embodiments of the present invention, larger "width" devices may also be formed by connecting several tri-gate transistors together.

Figure 1:
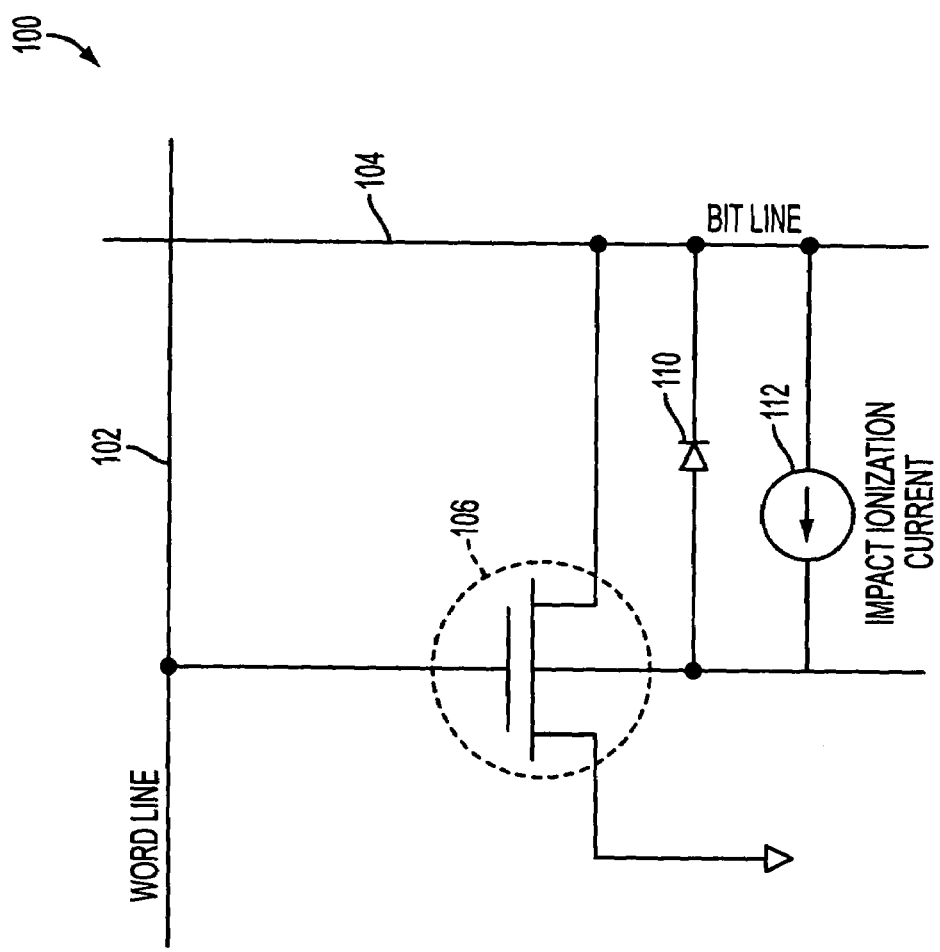
FIG. 1 illustrates a embodiment of a floating-body DRAM gain cell, according to embodiments of the invention.

FIG. 1 illustrates a functional diagram a FBDRAM gain cell, according to embodiments of the invention. In FIG. 1, a FBDRAM design 100 illustrates that the amount of charge on the floating body of the single transistor 106 in the cell determines the cell state. The body effect may modulate the on-state current of the transistor 106, and thus the cell state may be sensed and read. According to embodiments of the present invention, in order to write the cell, the body may be either discharged by forward biasing the drain to body diode 110, or charged by impact ionization current 112. Because charge may leak from/into the body through the source/drain diodes, the FBDRAM is a dynamic memory that requires periodic refresh to maintain state. In multi-cell embodiments of the present invention, the cells are organized into an array with word lines 102 and bit lines 104 to select rows and columns, respectively. In embodiments, the implementation in FIG. 1 may use a negative-channel metal oxide semiconductor (NMOS) in the cell, but a positive-channel metal oxide semiconductor (PMOS) may work as well.

In operation, the FBDRAM of FIG. 1 may, when the body/drain diode is forward biased, discharge the body into the "0" state. In another embodiment, the impact ionization current 112, which may flow when there is large drain current and large drain to source voltage, may charge the body into the "1" state. According to embodiments of the present invention, the cell state, which includes, but is not limited to, the amount of charge on the body may read by sensing current differences due to the body effect.

Figure 2:
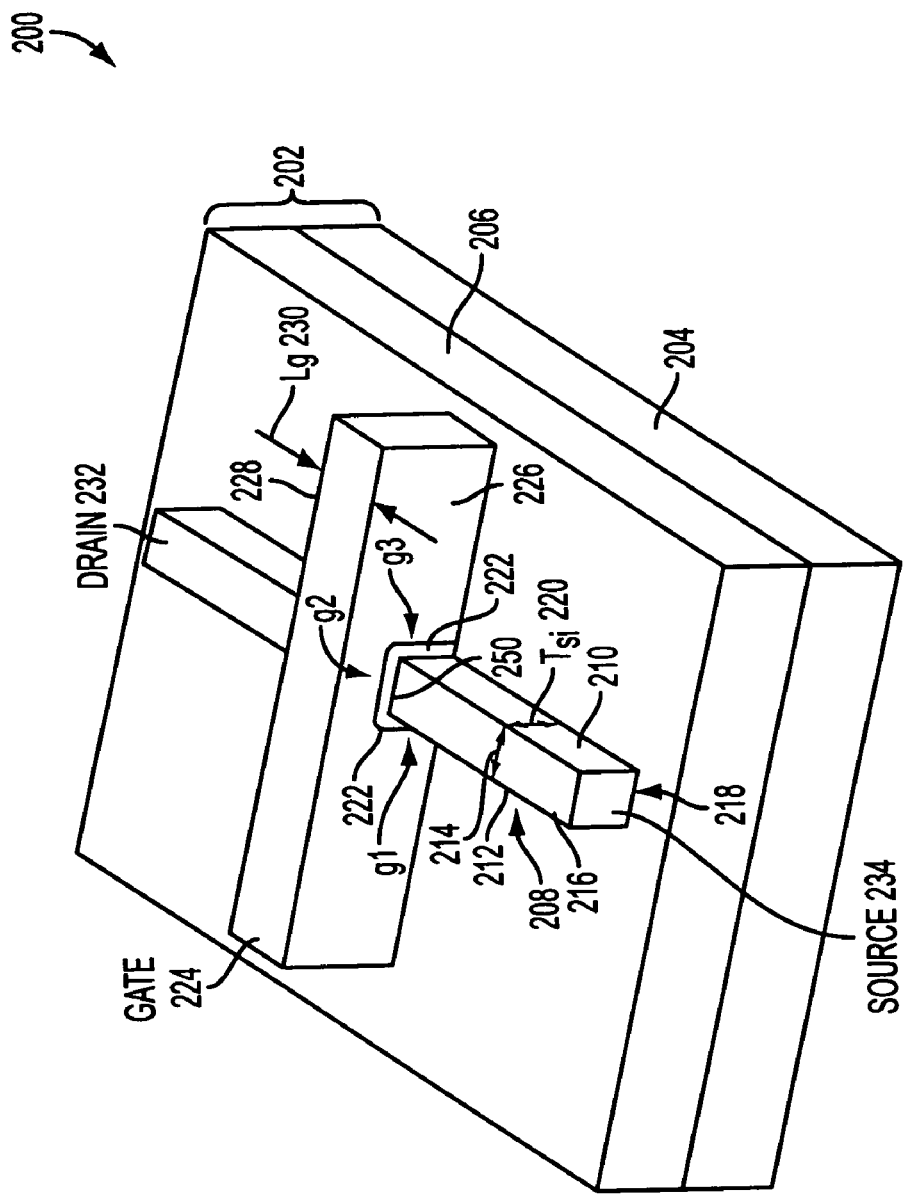
FIG. 2 illustrates a tri-gate transistor in accordance with embodiments of the invention.

In FIG. 1, the FBDRAM may be implemented using silicon-on-insulator (SOI) technology, where the devices are partially-depleted (PDSOI). According to the embodiments of the present invention, PDSOI may be necessary for FBDRAM in order to have a quasi-neutral floating-body to store the charge, to act as a storage node. The tri-gate device technology may target fully-depleted (FDSOI) operation for better scalability. In essence, the tri-gate device derives its name by having the gate wrap around three sides of a short, thin slab of SOI, as shown in FIG. 2. The silicon doping and thickness may be carefully engineered so that in conjunction, the three gates fully deplete the silicon.

FIG. 2 illustrates a tri-gate transistor in accordance with embodiments of the invention. Transistor 200 may illustrate the properties of the tri-gate technology, as they apply to the embodiment of the FBDRAM of the present Invention. Generally, the source 234/drain 232 of body 208 may represent a semiconductor or silicon body. The gate 224 may rest atop and surrounds three sides of the body 208, and the surface 206 may be an insulator (for example, but not limited to, silicon dioxide). The width 214 and height (tall) 220 of the slab of silicon 208 is surrounded from three sides by the gates (g1, g2, and g3), forming one top gate and two side gates. The width 214 and height 220 and doping may be engineered so that the silicon is depleted accordingly. In some implementations the silicon body 208 may be fully depleted. In embodiments of the present invention, the body 208 is only partially depleted.

Therefore, in embodiments of the invention, because there are three separate channels formed in the semiconductor body, the semiconductor body may be fully depleted when the transistor is turned "ON", thereby enabling the formation of a fully depleted transistor with gate lengths of less than 30 nanometers without requiring the use of ultra-thin semiconductor bodies or requiring photolithographic patterning of the semiconductor bodies to dimensions less than the gate length (Lg) of the device. That is, the structure of the tri-gate transistor of the present invention may enable a fully depleted transistor to be fabricated where the thickness of the semiconductor body and width of the semiconductor body are equal to the gate length of the device.

An example of a tri-gate transistor 200 in accordance with an embodiment of the present invention as illustrated in FIG. 2. Tri-gate transistor 200 is formed on a substrate 202. In an embodiment of the present invention, substrate 202 is an insulating substrate which includes a lower monocrystalline silicon substrate 204 upon which is formed in insulating layer 206, such as a silicon dioxide film. Tri-gate transistor 200, however, can be formed on any well-known insulating substrate such as substrates formed from silicon dioxide, nitrides, oxides, and sapphires. In an embodiment of the present invention, the substrate 202 can be a semiconductor substrate, such as but not limited to monocrystalline silicon substrate and gallium arsenide substrate.

Tri-gate transistor 200 includes a semiconductor body 208 formed on insulator 206 of insulating substrate 202. Semiconductor body 208 may be formed of any well-known semiconductor material, such as but not limited to silicon (Si), germanium (Ge), silicon germanium ($Si_xGe_y$), gallium arsenide (GaAs), InSb, GaP, GaSb and carbon nanotubes. Semiconductor body 208 may be formed of any well-known material which can be reversibly altered from an insulating state to a conductive state by applying external electrical controls. Semiconductor body 208 may be a single crystalline film when the best electrical performance of transistor 200, is desired. For example, semiconductor body 208 may be a single crystalline film when transistor 200 is used in high performance applications, such as in a high density circuit, such as a microprocessor. Semiconductor body 208, however, may be a polycrystalline film when transistor 200 is used in applications requiring less stringent performance, such as in liquid crystal displays. Insulator 206 may insulate semiconductor body 208 from monocrystalline silicon substrate 202.

In an embodiment of the present invention, semiconductor body 208 may be a single crystalline silicon film. Semiconductor body 208 may have a pair of laterally opposite sidewalls 210 and 212 separated by a distance which defines a semiconductor body width 214. Additionally, semiconductor body 208 may have a top surface 216 opposite a bottom surface 218 formed on substrate 202. The distance between the top surface 216 and the bottom surface 218 defines a body height 220. In an embodiment of the present invention the body height 220 may be substantially equal to the body width 214. In an embodiment of the present invention, the body 208 may have a width 214 and height 220 less than 30 nanometers and ideally less than 20 nanometers. In an embodiment of the present invention, the body height 220 may be between half of the body width 214 to two times the body width 214.

Tri-gate transistor 200 may have a gate dielectric layer 222. Gate dielectric layer 222 may be formed on and around three sides of semiconductor body 208 as shown in FIG. 2. Gate dielectric layer 222 may be formed on or adjacent to sidewall 212, on top surface 216 and on or adjacent to sidewall 210 of body 208 as shown in FIG. 2. Gate dielectric layer 222 may be any well-known gate dielectric layer. In an embodiment of the present invention, the gate dielectric layer may be a silicon dioxide ($SiO_2$), silicon oxynitride ($SiO_xN_y$) or a silicon nitride ($Si_3N_4$) dielectric layer. In an embodiment of the present invention, the gate dielectric layer 222 is a silicon oxynitride film formed to a thickness of between 5–20 Å. In an embodiment of the present invention, gate dielectric layer 222 may be a high K gate dielectric layer, such as a metal oxide dielectric, such as but not limited to tantalum pentaoxide ($Ta_2O_5$), and titanium oxide ($TiO_2$). Gate dielectric layer 222 may be other types of high K dielectric, such as but not limited to lead-zirconate titanate (PZT).

Tri-gate device 200 may have a gate electrode 224. Gate electrode 224 may be formed on and around gate dielectric layer 222 as shown in FIG. 2. Gate electrode 224 may be formed on or adjacent to gate dielectric 222 formed on sidewall 212 of semiconductor body 208, may be formed on gate dielectric 222 formed on the top surface 216 of semiconductor body 208, and may be formed adjacent to or on gate dielectric layer 222 formed on sidewall 210 of semiconductor body 208. Gate electrode 224 may have a pair of laterally opposite sidewalls 226 and 228 separated by a distance which defines the gate length (Lg) 230 of transistor 200. In an embodiment of the present invention, the laterally opposite sidewalls 226 and 228 of the gate electrode 224 may run in a direction perpendicular to the laterally opposite sidewalls 210 and 212 of semiconductor body 208.

Gate electrode 224 may be formed of any suitable gate electrode material. In an embodiment of the present invention, the gate electrode 224 may be comprised of polycrystalline silicon doped to a concentration density between $1 \times 10^{19}$ atoms/cm$^3$–$1 \times 10^{20}$ atoms/cm$^3$. In an embodiment of the present invention, the gate electrode may be a metal gate electrode, such as, but not limited to, tungsten, tantalum, titanium, and their nitrides. In an embodiment of the present invention, the gate electrode may be formed from a material having a mid-gap work function between 4.6–4.8 eV. As one of ordinary skill in the art would recognize, based at least on the teachings presented herein, the gate electrode 224 may not need to be a single material and may be a composite stack of thin films, such as, but not limited to a polycrystalline silicon/metal electrode or a metal/polycrystalline silicon electrode.

Tri-gate transistor 200 may have a source region 234 and a drain region 232. Source region 234 and drain region 232 may be formed in semiconductor body 208 on opposite sides of gate electrode 224 as shown in FIG. 2. The source region 234 and the drain region 232 may be formed of the same conductivity type, such as, but not limited to, N-type or P-type conductivity. In an embodiment of the present invention, the source region 234 and the drain region 232 have a doping concentration of between $1\times10^{19}$, and $1\times10^{21}$ atoms/cm$^3$. The source region 234 and the drain region 232 may be formed of uniform concentration or may include subregions of different concentrations or doping profiles, such as, but not limited to, tip regions (e.g., source/drain extensions).

In an embodiment of the present invention, when transistor 200 is a symmetrical transistor, the source region 234 and the drain region 232 may have the same doping concentration and profile. In an embodiment of the present Invention, when tri-gate transistor 200 may be formed as an asymmetric transistor then the doping concentration and profile of the source region 234 and the drain region 232 may vary in order to obtain a particular electrical characteristic.

The portion of semiconductor body 208 located between source region 234 and drain region 232, defines the channel region 250 of transistor 200. The channel region 250 may also be defined as the area of the semiconductor body 208 surrounded by the gate electrode 224. At times however, the source/drain region may extend slightly beneath the gate electrode through, for example, diffusion to define a channel region slightly smaller than the gate electrode length (Lg). In an embodiment of the present invention, the channel region 250 is intrinsic or undoped monocrystalline silicon. In an embodiment of the present invention, the channel region 250 is doped monocrystalline silicon. When channel region 250 is doped, it may be doped to a conductivity level of between $1\times10^{16}$ to $1\times10^{19}$ atoms/cm$^3$. In an embodiment of the present invention, when the channel region is doped it may be doped to the opposite conductivity type of the source region 234 and the drain region 232. For example, when the source and drain regions are N-type conductivity, the channel region would be doped to P-type conductivity. Similarly, when the source and drain regions are P-type conductivity, the channel region would be N-type conductivity. In this manner a tri-gate transistor 200 may be formed into either a NMOS transistor or a PMOS transistor respectively. Channel region 250 may be uniformly doped or may be doped non-uniformly or with differing concentrations to provide particular electrical and performance characteristics. For example, one of ordinary skill in the art would recognize, based at least on the teachings provided herein, that the channel regions 250 may include "halo" regions.

By providing a gate dielectric and a gate electrode which surrounds the semiconductor body on three sides, the tri-gate transistor may be characterized by having three channels and three gates. Gate one (g1) may extend between the source and drain regions on side 212 of silicon body 208. A second gate (g2) may extend between the source and drain regions on the top surface 216 of silicon body 208; and a third (g3) may extend between the source and drain regions on the sidewall 210 of silicon body 208. The gate "width" (Gw) of transistor 200 may be the sum of the widths of the three channel regions. That is, the gate width of transistor 200 is equal to the height 220 of silicon body 208 at sidewall 210, plus the width of silicon body of 208 at the top surface 216, plus the height 220 of silicon body 208 at sidewall 212. According to embodiments of the present invention, larger "width" transistors may be obtained by using multiple devices coupled together (e.g., multiple silicon bodies 208 surrounded by a single gate electrode 224). There may be other detrimental affects of such an embodiment, as one of ordinary skill in the art would appreciated, based at least on the teachings provided herein, including, but not limited to, the teachings of space considerations and the benefits of a wide and solid silicon body.

Because the channel region 250 is surrounded on three sides by gate electrode 224 and gate dielectric 222, transistor 200 may be operated in a fully depleted manner wherein when transistor 200 is turned "ON", the channel region 250 fully depletes thereby providing the electrical characteristics and performance of a fully depleted transistor. That is, when transistor 200 is turned "ON", a depletion region may be formed in channel region 250 along with an inversion layer at the surfaces of region 250 (i.e., an inversion layer is formed on the side surfaces and top surface of the semiconductor body). The inversion layer may have the same conductivity type as the source and drain regions and may form a conductive channel between the source and drain regions to allow current to flow. The depletion region may deplete free carriers from beneath the inversion layer. The depletion region may extend to the bottom of channel region 250, thus the transistor can be said to be a "fully depleted" transistor.

Fully depleted transistors may have improved electrical performance characteristics over non-fully depleted or partially depleted transistors. For example, operating transistor 200 in a fully depleted manner, gives transistor 200 an ideal or very steep sub-threshold slope. The tri-gate transistor may be fabricated with very steep sub-threshold slope of less than 80 mV/decade, and ideally about 60 mV/decade even when fabricated with semiconductor body thicknesses of less than 30 nm. Additionally, operating transistor 200 in the fully depleted manner, transistor 200 has an improved drain induced barrier (DIBL) low in effect which provides for better "OFF" state leakage which results in lower leakage and thereby lower power consumption. In an embodiment of the present invention, the tri-gate transistor 200 has a DIBL effect of less than 100 mV/V and ideally less than 40 mV/V.

Because the tri-gate transistor technology of the present invention may be operated in a partially depleted manner, the FBDRAM device may be characterized by a quasi-neutral region to store charge. According to an embodiment of the present invention, FBDRAM 300A is described in detail below with regard to FIG. 3A and the transistor 200 described above.

Figure 3A:
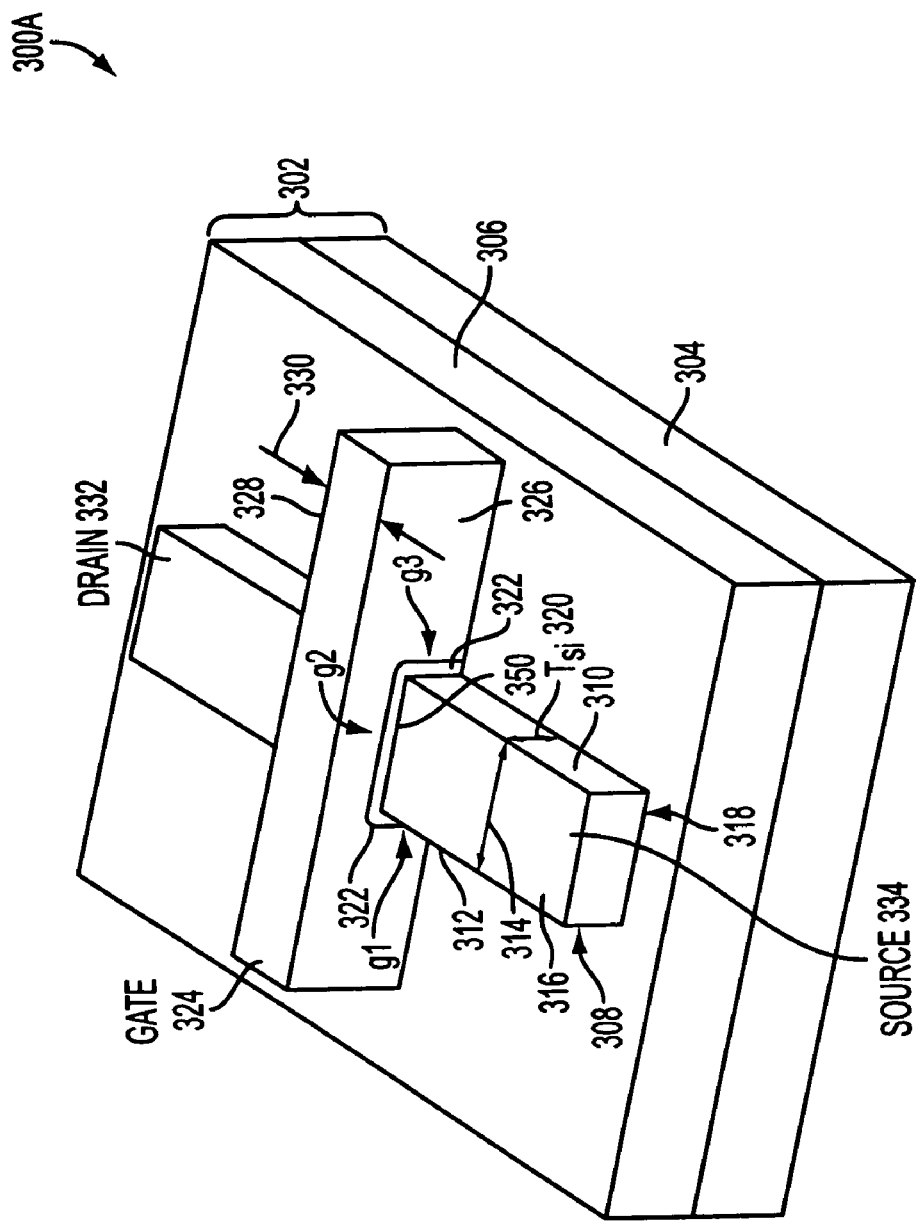
FIG. 3A illustrates a tri-gate transistor with partial-depletion silicon-on-insulator in accordance with an embodiment of the invention.

FIG. 3A illustrates a FBDRAM device with partial-depletion silicon-on-insulator (PDSOI) in accordance with an embodiment of the invention. In embodiments of the invention, because there are three separate channels formed in the semiconductor body, the semiconductor body may be partially depleted when the transistor is turned "ON", thereby enabling the formation of a partially depleted transistor with gate lengths of less than 30 nanometers because the semiconductor bodies are wide enough or may be patterned to dimensions greater than the gate length (Lg) of the device. That is, the structure of the tri-gate transistor of the present invention may enable a partially depleted transistor to be fabricated where the thickness of the semiconductor body and width of the semiconductor body are only relatively larger than the gate length of the device.

An example of a FBDRAM device 300A in accordance with an embodiment of present invention as illustrated in FIG. 3A. FBDRAM device 300A is formed on a substrate 302. In an embodiment of the present invention, substrate 302 is an insulating substrate which includes a lower monocrystalline silicon substrate 304 upon which is formed in insulating layer 306, such as a silicon dioxide film. FBDRAM device 300A, however, can be formed on any well-known insulating substrate such as substrates formed from silicon dioxide, nitrides, oxides, and sapphires. In an embodiment of the present invention, the substrate 302 may be a semiconductor substrate, such as but not limited to monocrystalline silicon substrate and gallium arsenide substrate.

The FBDRAM device 300A may be drawn with much larger width 314 to achieve PDSOI. The height 320 may remain the same as in FIG. 2. Simply, according to embodiments of the present invention, because the two side gates are now much further apart, they cannot fully deplete the silicon, resulting in a partially-depleted device. The resulting quasi-neutral floating-body that is left under the gate 324 may be used as a storage node for the FBDRAM device 300A.

It is very important to note, with respect to the embodiments of the present invention described herein, that a device with large width 314 may have worse short channel effects since the central silicon region under gate 324 is not fully depleted, i.e., there is no nearby gate to control the potential and prevent leakage. This is not much of a concern for the FBDRAM, according to some embodiments of the present invention, since an FBDRAM device may be drawn with longer than minimum channel length for at least, but not limited to, better matching characteristics.

Embodiments of the invention propose a method to fabricate FBDRAM devices, such as, but not limited to device 300A, in a process technology for manufacturing tri-gate devices, such as, but not limited to transistor 200. As indicated above, FBDRAM requires PDSOI, whereas by default, tri-gate technology gives FDSOI. However, tri-gate gives FDSOI only if the silicon is thin enough for the three gates to fully deplete the film. If the width of the silicon body of a device is much larger as shown in FIG. 3A, and described above, which may be easily achieved without incurring any cost by simply increasing width 314 of the device in layout processes, the two side gates cannot deplete the silicon in the center of the device. A quasi-neutral floating-body remains and thus, the device becomes PDSOI. The floating-body can now be used to store the charge that determines the state of the 1-transistor (1-T) FBDRAM device. According to embodiments of the present invention, the operation of the FBDRAM device 300A may be in accord with those described above with respect to FIG. 1, and further described in embodiments below.

According to an embodiment of the present invention, a partially depleted silicon-on-insulator transistor, similar to device 300A, may include a silicon body 308 formed on an insulating film 306, wherein the silicon body 308 has a top surface 316, a first laterally opposite sidewall 310, and a second laterally opposite sidewall 312; a gate dielectric 322 formed on and around the silicon body 308; a gate electrode 324 formed on the gate dielectric 322 on and around the silicon body 308; and a pair of source/drain regions 332–334 formed in the silicon body 308 on opposite sides of the gate electrode 324, wherein the gate electrode 324 may have a gate length less than or equal to half of a width between laterally opposite sidewalls of the silicon body 308, and when the transistor is turned "ON" the silicon body 308 between the source/drain regions is partially depleted to create a storage node. In an embodiment of the present invention, the storage node is a quasi-neutral floating-body.

In specific embodiments of the present invention, the gate length 330 may be less than 60 nanometers, and further reduce to less than 20 nanometers. In a relative embodiment, the gate length 330 may be less than or equal to the height of the silicon body on the insulating film 306.

The silicon body may be a single crystalline silicon film, and in some embodiments, the single crystalline silicon film may be intrinsic silicon.

In further embodiments, the transistor 300A may have a gate length 330 approximately equal to the distance between the first and second laterally opposite sidewalls of the silicon body. In alternative embodiments, the transistor 300A may have a gate length approximately equal to the distance from the insulating film 306 to the top surface of the silicon body 308. In additional embodiments, the distance 314 between the laterally opposite sidewalls of the silicon body 308 is approximately equal to the distance from the insulating substrate to the top surface of the silicon body. In still further embodiment, the distance between the laterally opposite sidewalls of the semiconductor is between half to two times the thickness of the silicon body on the insulating surface.

In an embodiment of the present invention, the device 300A may include a pair of sidewall spacers formed along laterally opposite sidewalls of the gate electrode.

In another embodiment, the pair of source/drain regions may include silicon formed on and around the silicon body. This silicon on the source/drain regions may be epitaxial silicon.

In accordance with the processes and devices described above, methods of forming a partially-depleting, silicon-on-insulator transistor may include, but are not limited to: patterning a silicon film formed on an insulating substrate 306 into a silicon body 308 having a top surface 316 opposite a bottom surface 318 formed on the insulating film 306, and a first and second laterally opposite sidewalls 310–312; forming a gate dielectric layer 322 on the top surface of the silicon body 308 and on the sidewalls 310–312 of the silicon body 308; depositing a gate material over the silicon body 308 and over the insulating substrate; patterning the gate material to form a gate electrode 324 on the gate dielectric layer on the top surface 316 of the silicon body 308 and adjacent to the gate dielectric 322 on the sidewalls 310–312 of the silicon body 308, the gate electrode 324 having laterally opposite sidewalls 326–328 which run perpendicular to the laterally opposite sidewalls 310–312 of the silicon body 328; and forming a pair of source/drain regions 332–334 in the silicon body 308 on opposite sides of the laterally opposite sidewalls of the gate electrode 324, wherein the gate electrode 324 has a gate length 330 less than or equal to half of a width between laterally opposite sidewalls of the silicon body 308.

In embodiments of the present invention, the gate length 330 may be approximately equal to the thickness 320 of the silicon body 308 on said insulating substrate 306. In alternative embodiments, the gate length 330 may be less than or equal to the thickness 320 of the silicon body 308 on the insulating film 306.

In further embodiments, the silicon film is single crystalline silicon, which may be intrinsic silicon.

In an embodiment of the present invention, the process or method also includes the operation of forming a pair of sidewall spacers on opposite sides of laterally opposite sidewalls of the gate electrode; and forming a silicon film on and around the silicon body and adjacent to the sidewall spacers. In an alternative embodiment, the process includes the operation of forming a silicide on the silicon film formed on the silicon body. The silicon film may be formed by a selective deposition process.

In embodiments of the present invention, as described in detail elsewhere herein, the FBDRAM device 300A may include: a silicon body 308 formed on an insulating film 306, wherein the silicon body 308 has a top surface 316, a first laterally opposite sidewall 310, and a second laterally opposite sidewall 312; a gate dielectric 322 formed on and around the silicon body 308; a gate electrode 324 formed on the gate dielectric 322 on and around the silicon body 308; a pair of source/drain regions 332–334 formed in the silicon body 308 on opposite sides of the gate electrode 324; and a storage node in a central region of the silicon body between the pair of source/drain regions, wherein the storage node is partially depleted to store a logic state. In an alternative embodiment, the storage node is a quasi-neutral floating-body.

According to embodiments of the present invention, the FBDRAM device may perform a write operation by using impact ionization to generate an excess body charge in the silicon body, wherein the excess body charge alters a threshold voltage of the pair of source/drain regions.

In an alternative embodiment, the device may perform a read operation by comparing a source/drain current of the source/drain regions to a reference current to obtain the logic state. In one embodiment, the amount of excess body charge may determine said logic state. In a further embodiment, the source/drain current may be modulated to allow the logic state to be at least one of sensed or read.

In an alternative embodiment, a write operation may use a forward biasing of a drain to body diode to discharge the silicon body.

In embodiments of the device, periodic refreshing may be performed to maintain the logic state. Furthermore, in embodiments, the device may be organized in an array of FBDRAM devices with at least one pair of bit and word lines to select at least one of columns and rows. Additionally, the device may be implemented in a positive-channel metal oxide semiconductor (PMOS), and alternatively, in a negative-channel metal oxide semiconductor (NMOS).

According to the embodiments described above, the FBDRAM may be implemented in a 1-transistor (1T) capacitorless DRAM using the body charging of a PDSOI transistor to store the logic "1" or "0" states. The write operation may be performed by using impact ionization to generate an excess charge in the floating body. The excess body charge alters the threshold voltage, and, thereby, the source/drain current of the transistor. Information may be read by comparing the source/drain current of the selected cell to the current of a reference cell. This 1T cell may allow for very dense memory arrays, particularly for embedded applications.

Figure 3B:
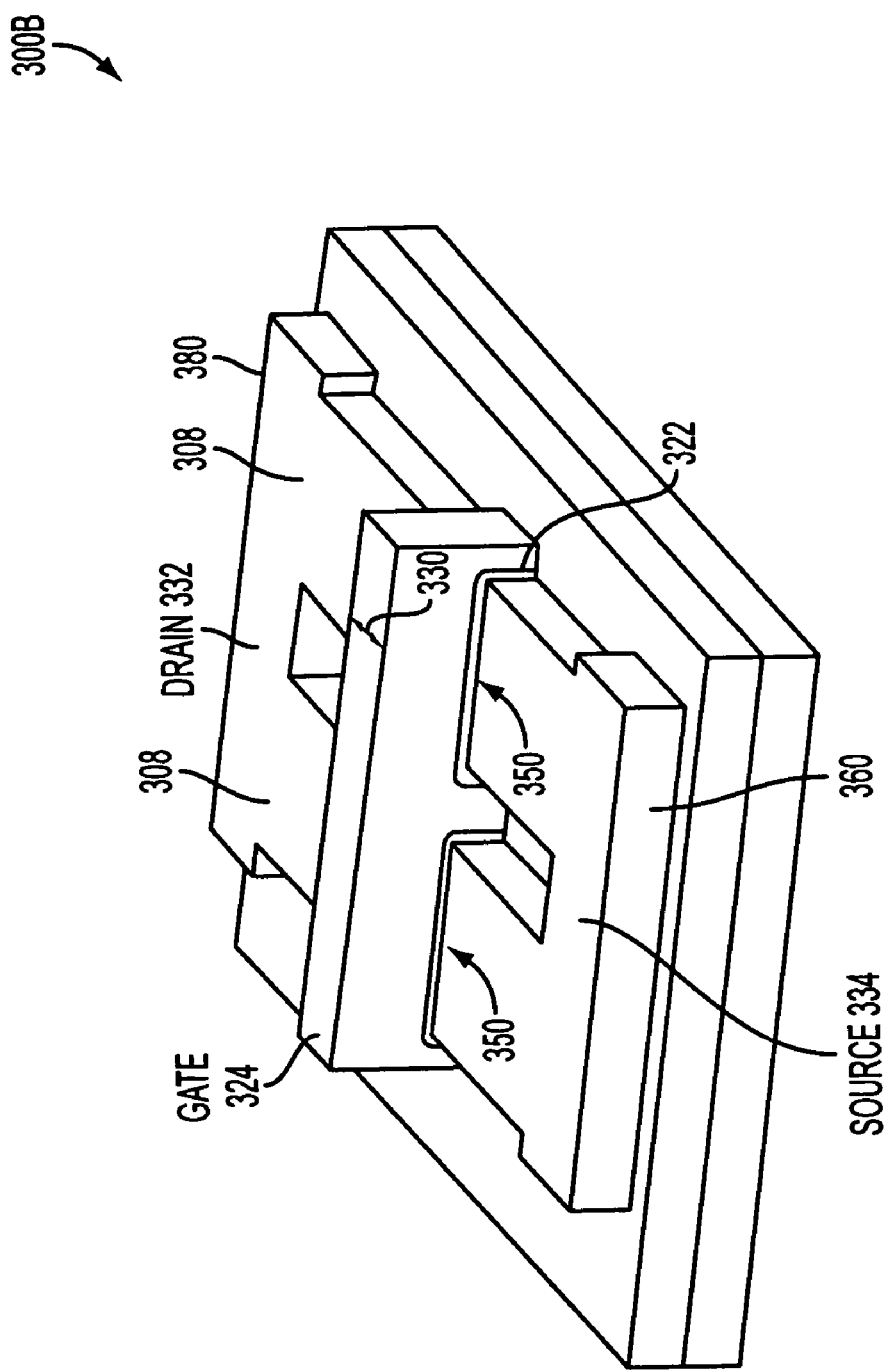
FIG. 3B illustrates a tri-gate transistor with partial-depletion silicon-on-insulator in accordance with another embodiment of the invention.

FIG. 3B illustrates a tri-gate transistor with PDSOI in accordance with another embodiment of the invention. As stated above with respect to transistor 200, and correlated to device 300A, the gate "width" of device 300A is equal to the sum of the three gate widths created from semiconductor body 308 of device 300A. In order to fabricate the transistors with larger gate widths, device 300A may include an additional or multiple semiconductor bodies or fingers 308 as shown in FIG. 3B.

Each semiconductor body 308 has a gate dielectric layer 322 formed on its top surface and sidewalls as shown in FIG. 3B. Gate electrode 324 is formed on and adjacent to each gate dielectric 322 on each of the semiconductor bodies 308. Each semiconductor body 308 may also include a source region 334 and a drain region 332 formed in the semiconductor body 308 on opposite sides of gate electrode 324 as shown in FIG. 3B. In an embodiment of the present invention, each semiconductor body 308 may be formed with the same width and height (thickness) as the other semiconductor bodies 308. In an embodiment of the present invention, each of the source regions 334 and drain regions 332 of the semiconductor bodies 308 may be electrically coupled together by the semiconductor material used to form semiconductor body 308 to form a source landing pad 360 and a drain landing pad 380 as shown in FIG. 3B.

Alternatively, the source regions 334 and drain regions 332 may be coupled together by higher levels of metalization (e.g., metal 1, metal 2, metal 3 . . . ) used to electrically interconnect various devices 300A and/or 300B together into functional circuits. The gate width 330 of device 300B as shown in FIG. 3B may be equal to the sum of the gate width created by each of the semiconductor bodies 308. In this way, the device 300B can be formed with any gate width desired.

Figure 4:
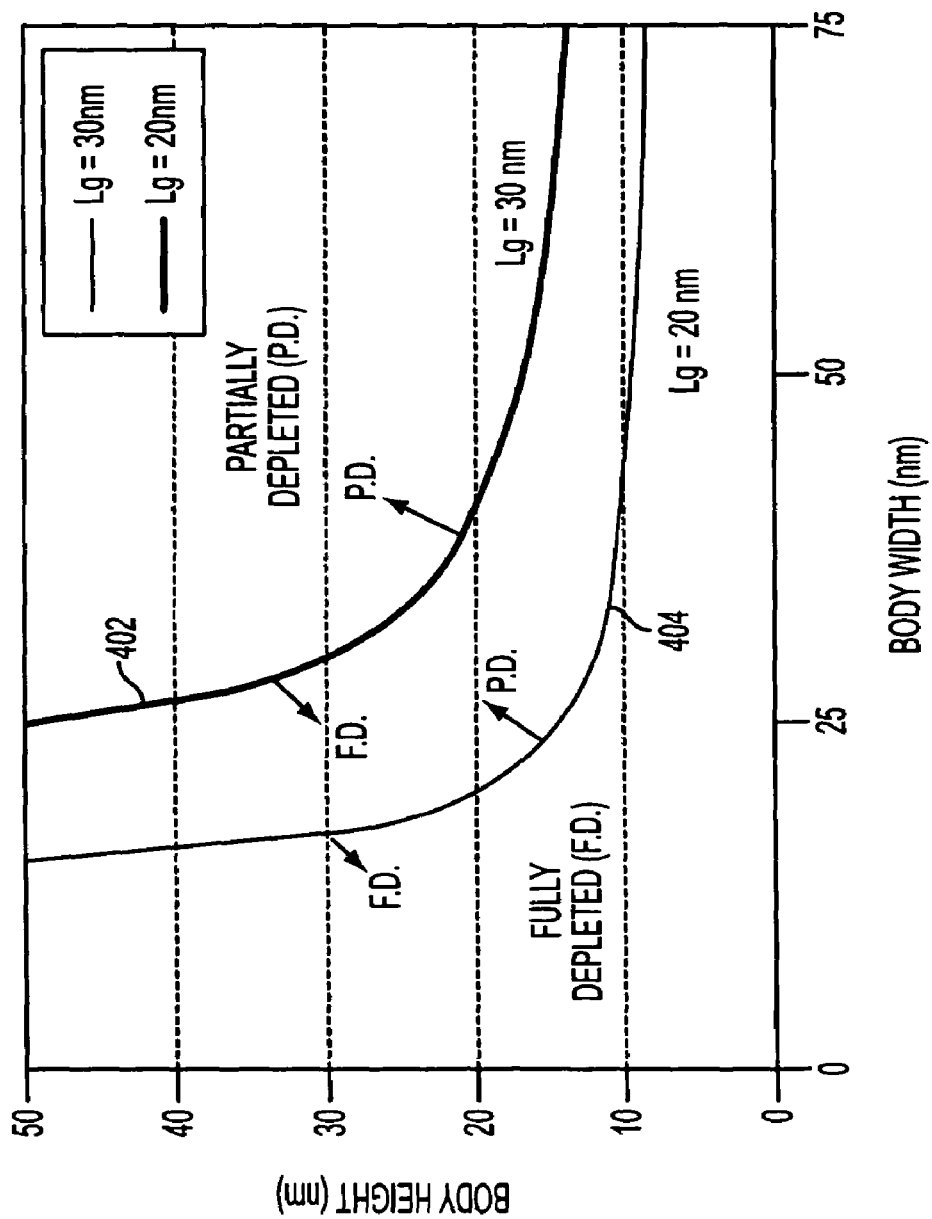
FIG. 4 is a plot which illustrates body heights and body widths which, according to embodiments of the invention, may be used to obtain partially depleted and fully depleted tri-gate transistors having gate lengths (Lg) of 30 nm and 20 nm, respectively.

FIG. 4 is a plot which illustrates body heights and body widths which, according to embodiments of the invention, may be used to obtain partially depleted and fully depleted tri-gate transistors having gate lengths (Lg) of 30 nm and 20 nm, respectively.

In FIG. 4, two plots 402 and 404 set forth the body height and body width which will produce either fully depleted (FD) or partially depleted (PD) tri-gate transistors having gate length (Lg) of 30 nm (402) and 20 nm (404) respectively. In an embodiment of the present invention, the body height, body width, and gate length are chosen to have dimensions in which a partially depleted transistor may be formed. In other embodiments, the tri-gate transistor has a body height, body width and gate length such that a fully depleted transistor may be formed.

The FBDRAM devices 300A and 300B may be said to be nonplanar transistors because the inversion layer of the channel regions 350 may be formed in both the horizontal and vertical directions in semiconductor body 308. The semiconductor device in accordance with embodiments of the present invention may also be considered a nonplanar device because, according to the embodiments herein, the electric field from the gate electrode 324 is applied from both horizontal (g2) and vertical sides (g1 and g3).

Figure 5C:
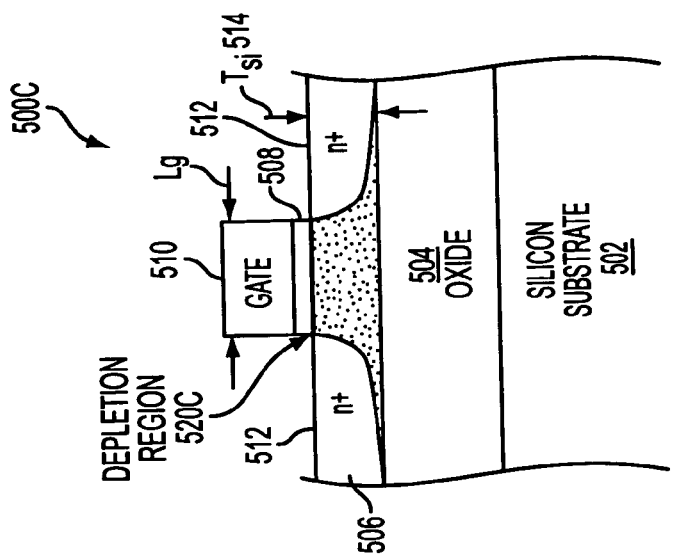
FIGS. 5A–5C are illustrations of cross-sectional views of a depleted substrate transistor in accordance with embodiments of the invention.
Figure 5B:
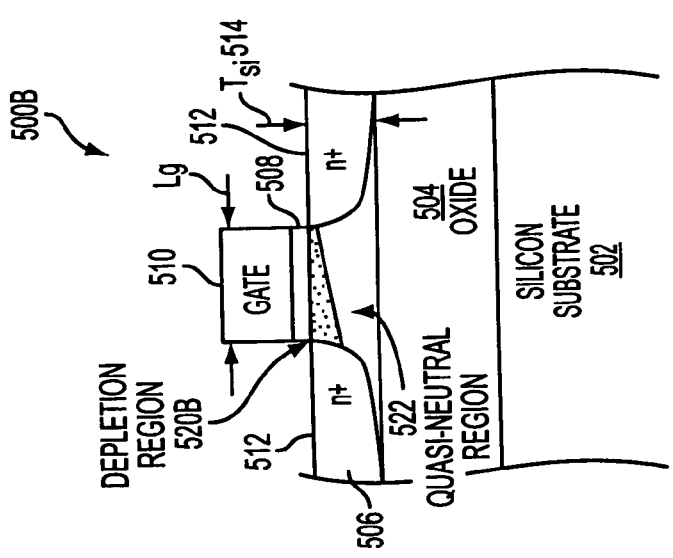
Figure 5A:
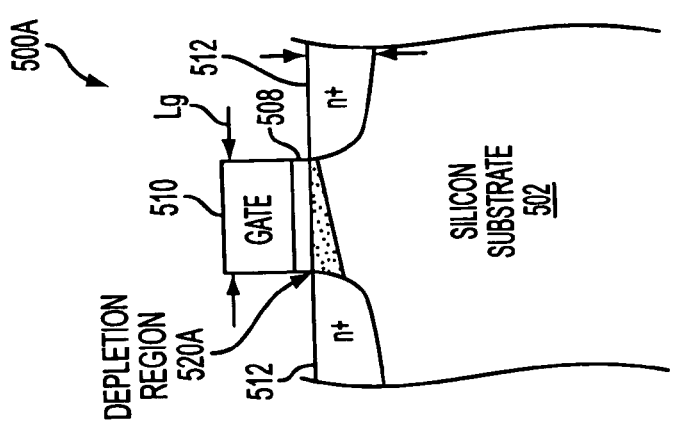

FIGS. 5A–5C are illustrations of cross-sectional views of a depleted substrate transistors in accordance with embodiments of the invention. Although they are shown in two-dimensions, one of ordinary skill in the art may envision them in three-dimensions to provide the respective depletion characteristics described in FIG. 4 above.

FIG. 5A shows the large undepleted region which results from a non-SOI implementation. FIG. 5B shows the PDSOI of the embodiments of the present invention. FIG. 5C shows a fully depleted silicon on insulator (SO) transistor 500C. In FIG. 5C, the SOI transistor 500C may include a single crystalline silicon substrate 502 having an insulating layer 504, such as a buried oxide formed thereon. A single crystalline silicon body 506 may be formed on the insulating layer 504. A gate dielectric layer 508 may be formed on the single crystalline silicon body 506 and a gate electrode 510 formed on the gate dielectric 508. Source 512 and drain 514 regions may be formed in the silicon body 506 along laterally opposite sides of gate electrode 510.

Device 500B of FIG. 5B may be similarly constructed as 500C, although, as indicated in the figure, the SOI transistor is only partially depleted and thus creates a quasi-neutral floating body which may be used, according to embodiments of the present invention, as a storage node.

Partially and fully depleted SOI have been proposed herein as a transistor structure to take advantage of ideal sub-threshold gradients for optimized on current/off current ratios. In order to achieve full depletion, sub-threshold gradients with transistor 500C, the thickness of the silicon body 506 must be about ⅓ the size of the gate length (Lg) of the transistor or Tsi=Lg/3. However, as gate lengths scale especially as they approach 30 nm, the need for ever decreasing silicon film thickness (Tsi) makes this approach increasingly impractical. At 30 nanometer gate length, the thickness required of the silicon body is thought to need to be less than 10 nanometers, and around 6 nanometer for a 20 nanometer gate length. The fabrication of thin silicon films with thicknesses of less than 10 nanometers is considered to be extremely difficult.

On one hand, obtaining wafer uniformity on the order of one nanometer is a difficult challenge. On the other hand, to be able to contact these thin films to form raised source/drain regions to decrease junction resistance, becomes almost impossible since the thin silicon layer in the source/drain regions becomes consumed during the gate etch and various cleans following the gate etch and spacer etch leaving insufficient silicon 506 for silicon to grow on. For PDSOI, any combination of altered dimensions may provide for creation of the quasi-neutral floating body, as one of ordinary skill in the art would recognize based at least on the teachings provided herein.

The process 600 used to fabricate a partially-depleting, silicon-on-insulator transistor in accordance with the embodiments of the present invention described herein is described in detail below with reference to FIG. 6. One of ordinary skill in the relevant art(s) would appreciate, based at least on the teachings provided herein, how to perform the method for forming the PDSOI transistor as FBDRAM device.

In accordance with embodiments of the present invention, the process 600 may include patterning a silicon film formed on an insulating substrate into a silicon body having a top surface opposite a bottom surface formed on the insulating film, and a first and second laterally opposite sidewalls, as shown in block 602. In embodiments of the present invention, the process may then proceed to block 604. At block 604, according to embodiments of the present invention, the process 600 may form a gate dielectric layer on the top surface of the silicon body and on the sidewalls of the silicon body. In accordance with embodiments of the present invention, the process 600 may then proceed to block 606.

In an embodiment of the present invention, at block 606, the process 600 may deposit a gate material over the silicon body and over the insulating substrate. According to embodiments of the present invention, the process 600 may then proceed to block 608. At block 608, according to embodiments of the present invention, the process 600 may pattern the gate material to form a gate electrode on the gate dielectric layer on the top surface of the silicon body and adjacent to the gate dielectric on the sidewalls of the silicon body, the gate electrode having laterally opposite sidewalls which run perpendicular to the laterally opposite sidewalls of the silicon body. The process 600, in accordance with embodiments of the present invention, may proceed to block 610.

At block 610, the process, in accordance with embodiments of the present invention, may form a pair of source/drain regions in the silicon body on opposite sides of the laterally opposite sidewalls of the gate electrode, wherein the gate electrode has a gate length less than or equal to half of a width between laterally opposite sidewalls of the silicon body. In alternative embodiments of the present invention, the process 600 may form the gate length to approximately equal to the thickness of the silicon body on the insulating substrate. In another embodiment of the present invention, the process 600 may form the gate length to less than or equal to the thickness of the silicon body on the insulating film.

In further embodiments of the present invention, the silicon film may be a single crystalline silicon. In a further embodiment of the present invention, the single crystalline silicon film may be intrinsic silicon.

In accordance with embodiments of the present invention, the process 600, as illustrated in FIG. 6, may optionally proceed from block 610 to any of blocks 612–618. These optional blocks are now described. At block 612, the process 600, according to embodiments of the present invention, may form a pair of sidewall spacers on opposite sides of laterally opposite sidewalls of the gate electrode. At block 614, the process 600, according to embodiments of the present invention, may form a silicon film on and around the silicon body and adjacent to the sidewall spacers. At block 616, in accordance with embodiments of the present invention, the process 600 may form a silicide on the silicon film formed on the silicon body. At block 618, in embodiments of the present invention, the process 600 may form the silicon film by a selective deposition process.

The embodiments of the present invention may demonstrate superior scalability of the tri-gate device for future process technologies. The present invention may provide a method to integrate DRAM, and hence much larger memory caches, without additional process complexity or cost. Compared to conventional 6T SRAM, the FBDRAM cell may allows more cache memory to be integrated with a microprocessor. This may improve processor performance efficiently, both in terms of area and power, which ultimately translates to lower cost. FBDRAM may be implemented with no change to the standard tri-gate process flow.

Any microprocessor or memory integrated circuit company may have use for this particular FBDRAM implementation due to its scalability to future tri-gate and other non-planar, SOI process technologies (such as "Fin-FET"). Such technologies, according to embodiments of the present invention, may be implemented in non-planar SOI device technologies.

While various embodiments of the present invention have been described above, it should be understood that they have been presented by way of example only, and not limitation. Thus, the breadth and scope of the present invention should not be limited by any of the above-described exemplary embodiments, but should instead be defined only in accordance with the following claims and their equivalents.

What is claimed is:

1. A partially depleted silicon-on-insulator transistor, comprising:
    a silicon body formed on an insulating film, wherein said silicon body has a top surface, a first laterally opposite sidewall, and a second laterally opposite sidewall;
    a gate dielectric formed on and around said silicon body;
    a gate electrode formed on said gate dielectric on and around said silicon body; and a pair of source/drain regions formed in said silicon body on opposite sides of said gate electrode, wherein said gate electrode has a gate length less than or equal to half of a width between laterally opposite sidewalls of said silicon body, and when said transistor is turned "ON" said silicon body between said source/drain regions is partially depleted to create a storage node.

2. The transistor of claim 1, wherein said storage node is a quasi-neutral floating-body.

3. The transistor of claim 1, wherein said gate length is less than about 60 nanometers.

4. The transistor of claim 1 wherein said gate length is less than or equal to the height of said silicon body on said insulating film.

5. The transistor of claim 1 wherein said silicon body is a single crystalline silicon film.

6. The transistor of claim 5 wherein said single crystalline silicon film is intrinsic silicon.

7. The transistor of claim 1, wherein said transistor has a gate length approximately equal to the distance between said first and second laterally opposite sidewalls of said silicon body.

8. The transistor of claim 1, wherein said transistor has a gate length approximately equal to the distance from said insulating film to the top surface of said silicon body.

9. The transistor of claim 1, wherein the distance between said laterally opposite sidewalls of said silicon body is approximately equal to the distance from said insulating substrate to the top surface of said silicon body.

10. The transistor of claim 1, wherein the distance between said laterally opposite sidewalls of said semiconductor is between approximately one-half and two times the thickness of said silicon body on said insulating surface.

11. The transistor of claim 1, further comprising:
a pair of sidewall spacers formed along laterally opposite sidewalls of said gate electrode.

12. The transistor of claim 1, wherein said pair of source/drain regions further comprises silicon formed on and around said silicon body.

13. The transistor of claim 12, wherein said silicon on said source/drain regions is epitaxial silicon.

14. A method of forming a partially-depleting, silicon-on-insulator transistor, comprising:
patterning a silicon film formed on an insulating substrate into a silicon body having a top surface opposite a bottom surface formed on said insulating film, and a first and second laterally opposite sidewalls;
forming a gate dielectric layer on said top surface of said silicon body and on said sidewalls of said silicon body;
depositing a gate material over said silicon body and over said insulating substrate;
patterning said gate material to form a gate electrode on said gate dielectric layer on said top surface of said silicon body and adjacent to said gate dielectric on said sidewalls of said silicon body, said gate electrode having laterally opposite sidewalls which run perpendicular to the laterally opposite sidewalls of said silicon body; and
forming a pair of source/drain regions in said silicon body on opposite sides of said laterally opposite sidewalls of said gate electrode, wherein said gate electrode has a gate length less than or equal to half of a width between laterally opposite sidewalls of said silicon body.

15. The method of claim 14, wherein said gate length is approximately equal to the thickness of said silicon body on said insulating substrate.

16. The method of claim 14, wherein said gate length is less than or equal to the thickness of said silicon body on said insulating film.

17. The method of claim 14, wherein said silicon film is single crystalline silicon.

18. The method of claim 17, wherein said single crystalline silicon film is intrinsic silicon.

19. The method of claim 14, further comprising:
forming a pair of sidewall spacers on opposite sides of laterally opposite sidewalls of said gate electrode; and
forming a silicon film on and around said silicon body and adjacent to said sidewall spacers.

20. The method of claim 14, further comprising:
forming a silicide on said silicon film formed on said silicon body.

21. The method of claim 14, further comprising:
forming said silicon film by a selective deposition process.

22. A floating-body, dynamic random access memory (FBDRAM) device, comprising:
a silicon body formed on an insulating film, wherein said silicon body has a top surface, a first laterally opposite sidewall, and a second laterally opposite sidewall;
a gate dielectric formed on and around said silicon body;
a gate electrode formed on said gate dielectric on and around said silicon body;
a pair of source/drain regions formed in said silicon body on opposite sides of said gate electrode; and
a storage node in a central region of said silicon body between said pair of source/drain regions, wherein said storage node is partially depleted to store a logic state.

23. The device of claim 22, wherein said storage node is a quasi-neutral floating-body.

24. The device of claim 22, wherein a write operation uses impact ionization to generate an excess body charge in said silicon body, wherein said excess body charge alters a threshold voltage of said pair of source/drain regions.

25. The device of claim 24, wherein the amount of excess body charge determines said logic state.

26. The device of claim 25, wherein said source/drain current is modulated to allow said logic state to be at least one of sensed or read.

27. The device of claim 22, wherein a read operation compares a source/drain current of said source/drain regions to a reference current to obtain said logic state.

28. The device of claim 22, wherein a write operation uses a forward biasing of a drain to body diode to discharge said silicon body.

29. The device of claim 22, wherein periodic refreshing of said device is performed to maintain said logic state.

30. The device of claim 22, wherein said device is organized in an array of FBDRAM devices with at least one pair of bit and word lines to select at least one of columns and rows.

* * * * *